United States Patent [19]

Komiyama

[11] Patent Number: 5,034,855
[45] Date of Patent: Jul. 23, 1991

[54] PRINTED CIRCUIT ASSEMBLY
[75] Inventor: Takeshi Komiyama, Nagano, Japan
[73] Assignee: Fujitsu Limited, Kawasaki, Japan
[21] Appl. No.: 542,105
[22] Filed: Jun. 22, 1990
[30] Foreign Application Priority Data Jul. 4, 1989 [JP] Japan .................. 1-173332

[51] Int. Cl.$^5$ .............................. G11C 11/00
[52] U.S. Cl. .................................. 361/416
[58] Field of Search ............ 174/52.2, 260; 361/393, 361/395, 396, 400, 403, 404, 405, 409, 416

[56] References Cited
U.S. PATENT DOCUMENTS 4,739,444  4/1988  Zushi et al. ............. 361/383
4,754,366  6/1988  Hernandez ............. 361/403

Primary Examiner—Leo P. Picard
Assistant Examiner—Donald Sparks
Attorney, Agent, or Firm—Staas & Halsey

[57] ABSTRACT

On a printed circuit board, according to the present invention, IC packages are arranged in a matrix layout. The IC packages are soldered to the printed circuit board via their lead wires provided on the package sides along row and column lines of the matrix chip components are soldered to the printed circuit board, under each of the IC packages along lines angularly deviated from the row lines or the column lines of the matrix. Thus, the soldered portion of a chip component behind its adjacent chip component can be visually inspected along a view line parallel to the row line or the column line on a highly integrated printed circuit board.

15 Claims, 2 Drawing Sheets

PRINTED CIRCUIT ASSEMBLY

BACKGROUND OF THE INVENTION

1. Field of the Invention

The present invention relates to a printed circuit board for mounting electronic parts thereon and particularly to a printed circuit board which is suitable for three dimensional high density mounting of surface mount type chip components.

2. Description of the Related Art

A chip-type component (referred to hereinafter as chip component) of a resistor, a capacitor or a coil, etc., which is surface mount type electronic part, is soldered to the printed circuit board as follows. First, a foot print formed in a predetermined pattern on a predetermined position on the printed circuit board is coated with solder cream by a screen printing method; next, the printed circuit board having electrodes of the chip components mounted on the foot print is heated in a heating furnace so that the chip components are soldered to the foot print by melting the solder cream. An IC package sealing an IC (Integrated Circuit) chip therein with a resin mold, etc. is also soldered, in the same manner as the chip components explained above, to lead-connecting patterns on the printed circuit board via a plurality of lead wires led out of the IC package.

FIG. 1 is a plan view of a plan of a prior art high density surface mount type printed circuit board 1. A plurality of IC packages 3 are mounted in the form of a matrix upon a surface of printed circuit board 1. Each IC package denoted with the numeral 3 is sequentially indicated with suffix as $3_{-11}$, $3_{-12}$, $3_{-13}$, etc. in the row direction $X_m$ and $3_{-11}$, $3_{-21}$, $3_{-31}$, etc. in the column direction $Y_n$. A chip capacitor 4 is respectively mounted, as indicated by broken lines, under the center area of each IC package 3 on the surface of the printed circuit board 1 in order to absorb switching noises generated by each IC package. Each chip capacitor 4 is indicated, corresponding to suffix of IC package, $4_{-11}$, $4_{-12}$, $4_{-13}$, etc. in the row direction $X_m$ and $4_{-11}$, $4_{-12}$, $4_{-13}$, etc. in the column direction $Y_n$. Each IC package 3 leads out a plurality of lead-wires $3a$ and $3b$ from both side surfaces in the longitudinal direction. The lead-wires $3a$, and $3b$ are soldered to wiring patterns on the printed circuit board 1, but these are not illustrated in FIG. 1.

Each chip capacitor 4 has a pair of electrodes, not illustrated, to be soldered to wiring patterns prepared on the surface of printed circuit board corresponding to the electrodes under the central area of each IC package.

In the parts layout of FIG. 1, soldering of IC package 3 can be visually inspected. Soldering of the chip capacitors located in the outer most row of the matrix (namely, $4_{-11}$, $4_{-12}$, $4_{-13}$ of the first row $X_1$ and $4_{-31}$, $4_{-32}$, $4_{-33}$ of the 3rd row $X_3$), can be visually inspected along the directions B and B' in FIG. 1. However, chip capacitors $4_{-21} \sim 4_{-23}$ located in the second row $X_2$ other than the outer most rows are shaded respectively by the overlap of chip capacitors or lead-wires of IC packages in the outer rows, causing a problem in that the visual inspection is no longer possible.

SUMMARY OF THE INVENTION

It is general object of the invention to provide a highly integrated printed circuit board where is allowed a visible inspection of soldering of chip components mounted under electronic components arranged in a matrix layout on the printed circuit board.

On a printed circuit board according to the present invention, there are arranged IC packages in a matrix layout, which are soldered to the printed circuit board via their lead wires provided on the package sides, and there are chip components soldered to the printed circuit board between each of the IC packages and the printed circuit board, on lines angularly deviated from the low lines or the column lines of the matrix. Thus, the soldered portion of a chip component behind its adjacent chip component can be visually checked along a view line parallel to the row line or the column line.

The above-mentioned features and advantages of the present invention, together with other objects and advantages, which will become apparent, will be more fully described hereinafter, with reference being made to the accompanying drawings which form a part hereof, wherein like numerals refer to like parts throughout.

DESCRIPTION OF THE PREFERRED EMBODIMENTS

Figure 2:
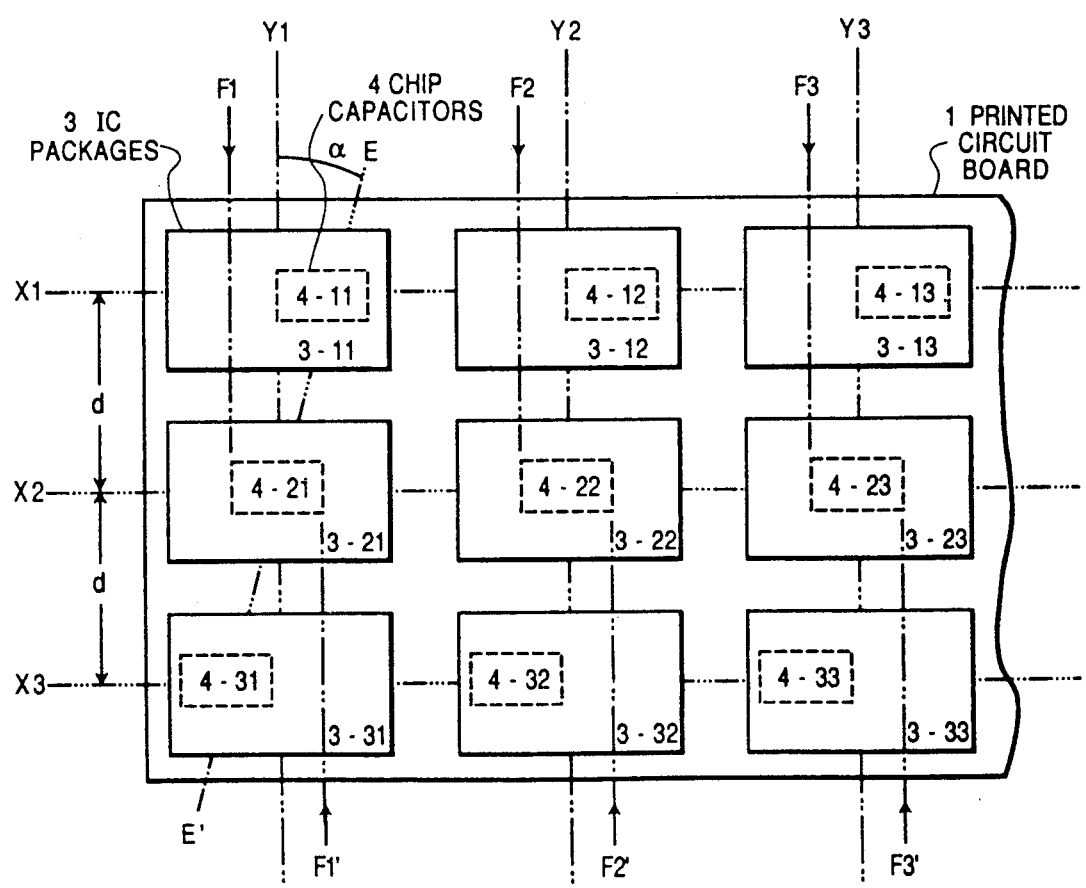
FIG. 2 is a view of a plan of a printed circuit board according to the present invention.
Figure 3:
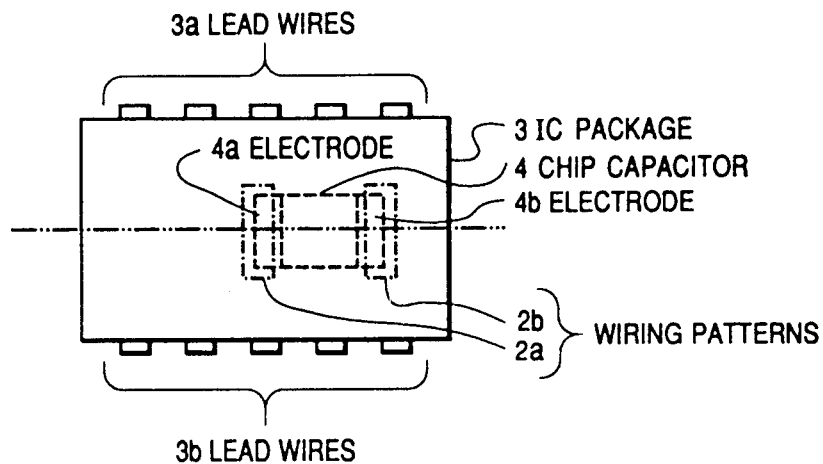
FIG. 3 is an enlarged view of an IC package and a chip capacitor thereunder of a preferred embodiment of the present invention.
Figure 4:
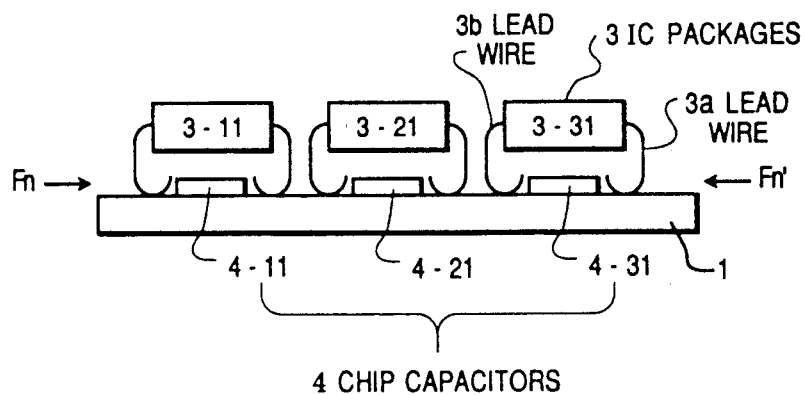
FIG. 4 is a side view along a row direction of the printed circuit board of the FIG. 2.

A preferred embodiment of the present invention will be explained with reference to a plan view of parts layout on the printed circuit board in FIG. 2, an enlarged plan view in FIG. 3 and a side elevation in FIG. 4. The like elements are denoted with the like reference numerals throughout the drawings to aid an understanding of structure and operations and to avoid repeated explanation.

Each IC package 3 has main surfaces, for example, of $(10 \sim 15)\text{mm} \times 16$ mm and thickness of 2.6 mm, and lead wires of typically 0.43 mm in diameter are led out of the longitudinal package-sides so as to be bent orthogonally to the main surface, typically with a pitch of 1.27 mm. Nine IC packages, in total, are mounted on the printed circuit board 1 in a form of a matrix having three rows and three columns by soldering the lead wires thereof to the well-known but not-illustrated wiring patterns formed with copper foil provided on the printed circuit board 1. Printed circuit board 1 is rectangular, i.e. long in the X direction and short in Y direction. Each IC package 3 in the m-th row and n-th column of the matrix is respectively denoted with suffix 3-mn. Each IC package is arranged with equal pitch so that central points thereof are located on centre lines $X_m$ and $Y_n$ (the suffixes m and n respectively indicate the m-th row and n-th column) where center lines $X_m$ and $Y_n$ are orthogonal with each other. Moreover, an about 0.7 mm high space is provided by the lead wires, between the bottom surface of the IC package 3 and the printed circuit board 1. The chip capacitors 4 typically formed leadless (i.e. having no leads), in typically 2.5 mm×3.2 mm×0.5 mm thick size, are mounted in the space as shown in FIG. 4, where electrodes 4a and 4b are respectively soldered as shown in FIG. 3 to the widely used wiring patterns 2a and 2b (FIG. 3) formed with copper foil provided on the printed circuit board 1.

A plan view of the layout of chip capacitors 3 by the present invention is as explained hereunder. The chip capacitors 4-m1 belonging to the first column are located on the line E—E' passing through the center of central IC package 3-21 and being deviated by angle $\alpha$ shown in FIG. 2 from the center line Y1 of the IC package 3-m1 belonging to the first column. Like the chip capacitors 4m1 of the first column, the chip capacitors 4-m2 of the second column are also located on a straight line deviated by angle $\alpha$ from the center line $Y_2$ of IC packages 3-m2 belonging to the second column. This relationship is also applied to the third and successive columns. Chip capacitors 4-1n of the first column are located on the center line $X_1$ of the IC packages 3-1n belonging to the first row. This relationship is also applied to the chip capacitors of each row on and after the second row. Accordingly, in other words, when the pitch of each row is d mm, the adjacent chip capacitors on each column are deviated by d.tan $\alpha$ mm along each row direction.

In above explanation of the present invention, though the layout of chip capacitors has been explained with reference to the layout of IC package, these electronic components are mounted on the printed circuit board in the following sequence. First, the area to be soldered, of wiring patterns on the printed circuit board, is coated with paste solder; next, electrodes of chip capacitors 4 are placed thereon; and IC packages 3 are placed over capacitors 4 so that the lead wires sit on the corresponding paste solder. The capacitors and IC packages are tentatively fixed to the printed circuit board 1 by adhesivity of the paste solder. The printed circuit board 1 thus tentatively holding the capacitors and IC packages is introduced into a heating furnace. Thereby, the paste solder is melt and these electronic components are soldered to the printed circuit board. The printed circuit board taken out of the furnace is inspected visually or by the use of a microscope, if required, through clearances between lead wires of IC packages 3 along directions F1∼F3 and F1'∼F3' of FIG. 2, so that the soldering condition of chip capacitors are checked. In this case, the laterally deviated part d.tan $\alpha$ mm of chip capacitor overlapped along the view line behind the front capacitor can be observed. Thus, visual inspection can be certainly carried out by selecting the value d.tan $\alpha$ mm as a value sufficient for inspection of the soldered areas. The angle $\alpha$ of about 5° has provided a satisfactory result for the electronic components of the sizes mentioned above, and spaced by 10. 8 mm pitch.

Figure 1:
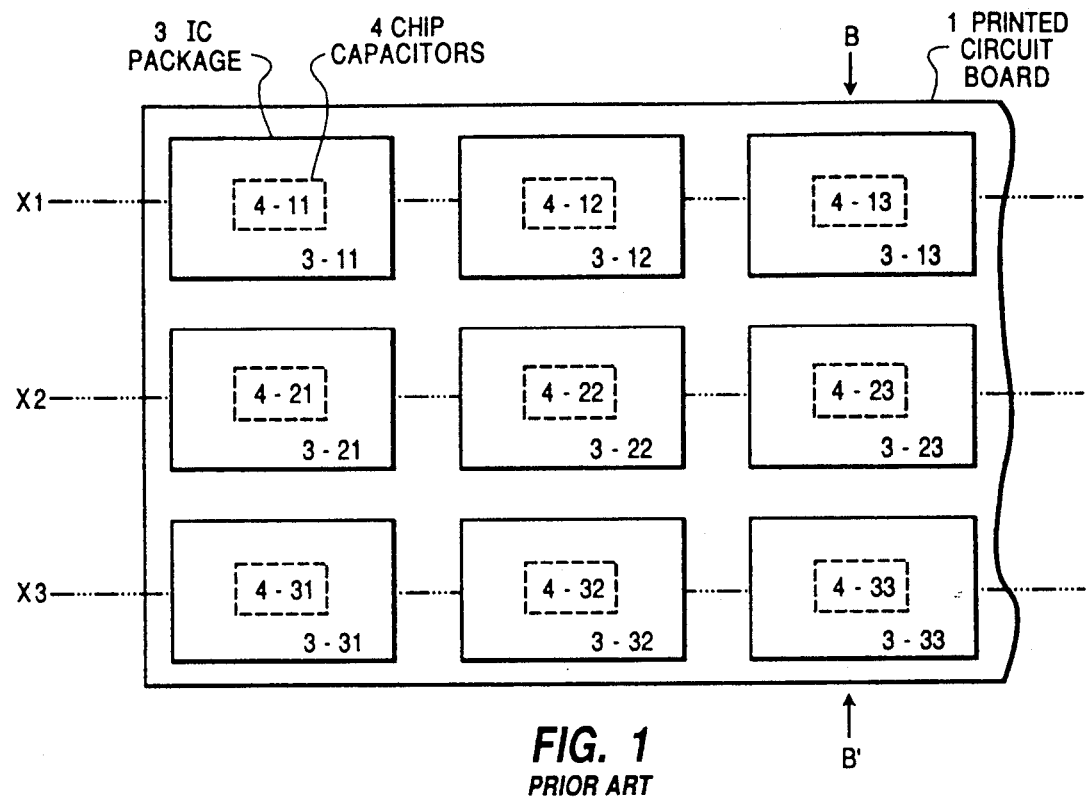
FIG. 1 is a view of a plan of a prior art printed circuit board.
Figure 5:
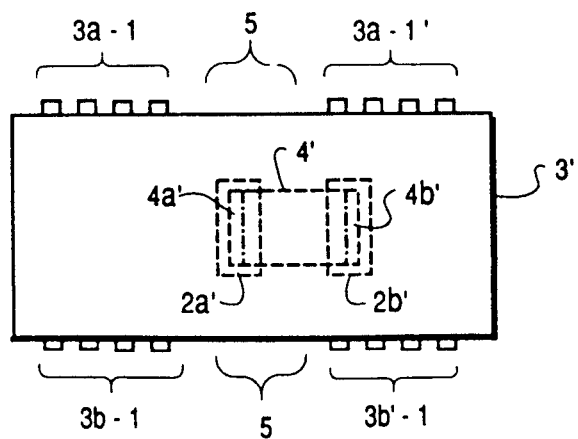
FIG. 5 is an enlarged view of an IC package and a chip capacitor thereunder, as another preferred embodiment of the present invention.

In FIG. 5, another type of IC package 3', a chip capacitor 4' having its electrodes 4a' and 4b' and their wiring patterns 2a' and 2b' are shown as a second preferred embodiment of the present invention. IC package 3' is different from IC package 3 of FIG. 3 in that there are wide gaps 5 between two groups of lead wires 3a-1 and 3a-1' on a side of the IC package, and between two groups of lead wires 3b-1 and 3b-1' on an opposite side of the package. Within these groups, the wiring leads having the same diameter 0.43 mm as that of FIG. 1 are uniformly spaced by the same pitch 1.27 mm as that of FIG. 3. Gaps 5 being for example, 4.7 mm allows an easy and reliable visual check of soldered electrodes 4a' and 4b' of chip capacitors 4'.

In the preferred embodiment, the chip capacitors are located on the center lines of the IC packages of each row but it is also possible to locate the IC packages on a straight line deviated by the predetermined angle from the center line $X_n$ thereof in the relevant row. This layout is particularly effective for a square IC package having the lead wires led out of its four sides.

In above preferred embodiment, the electronic components located under the IC package are referred to as chip capacitors, but it is apparent that the present invention can be applied also to chip resistors or chip coil, chip transistor, etc.

Moreover, in above preferred embodiment the chip capacitors having no lead wires are referred to; however, the present invention can apparently be applied to the electronic components having lead wires such as transistor and coil, etc.

In addition, in above preferred embodiment, an IC package having particular sizes has been referred to for the upper side electronic components; however, the present invention can also be applied to the case where the upper side electronic components are other than the IC packages.

In above preferred embodiment, the upper side electronic components are arranged in the form of orthogonal matrix, but it is apparent that the present invention can also be applied to the case where the matrix is not substantially orthogonally formed.

In above figures for explaining the preferred embodiment, a matrix is formed with three rows and three columns; however it is also apparent that the present invention can also be applied to a matrix formed with arbitrary number of rows and columns.

According to the structure of the present invention, the number of rows and columns of matrix can be increased in accordance with the shape and size of respective electronic components.

Though in the above preferred embodiment, the IC packages are arranged in the form of a matrix, the present invention can also be applied to the case where the IC packages 3 are not arranged in the form of a matrix but in the form of a single straight line. Namely, the chip components are soldered only along the straight line EE' (of FIG. 2) angularly deviated by the predetermined angle $\alpha$ from the straight line $Y_1$ connecting the centers of IC packages 3-n1. Even in the case where it is impossible to conduct visual inspection of the chip components 4-n1 along the direction $X_1 \sim X_3$ due to the obstruction of peripheral components, the visual inspection can be conducted for the chip components 4-n1 along the direction of $F_1$ and $F_1'$.

The many features and advantages of the invention are apparent from the detailed specification and thus, it is intended by the appended claims to cover all such features and advantages of the system which fall within the true spirit and scope of the invention. Further, since numerous skilled in the art, it is not desired to limit the described, and accordingly, all suitable modifications and equivalents may be resorted to, falling within the scope of the invention.

What I claim is:

1. A printed circuit board assembly for a printed circuit board, comprising:
   a plurality of first electronic components mounted on the printed circuit board, said first electronic components being arranged substantially along column and row lines of a matrix; and a plurality of second electronic components mounted on the printed circuit board, each of said second electronic components disposed between one of said first electronic components and the printed circuit board, said second electronic components being arranged substantially along a pitched line having an angular deviation from at least one of the column and row lines of the matrix.

2. A printed circuit board assembly as recited in claim 1, wherein the angular deviation of the pitched line is adequate for each of said second electronic components to be observed from along one of a column direction and a row direction.

3. A printed circuit board assembly as recited in claim 1, wherein said first electronic components are mounted to the printed circuit board via a plurality of lead wires arranged on a periphery of each of said first electronic components.

4. A printed circuit board assembly as recited in claim 1, wherein said first electronic component is an integrated circuit.

5. A printed circuit board assembly as recited in claim 1, wherein said second electronic component is a chip component.

6. A printed circuit board assembly as recited in claim 5, wherein at least one of said second electronic components has two groups of electrodes to be soldered to said printed circuit board, each of said groups lying substantially on the pitched line.

7. A printed circuit board assembly for a printed circuit board, comprising:

a plurality of first electronic components mounted on the printed circuit board, said first electronic components being arranged substantially on a first line; and a plurality of second electronic components having electrodes soldered on the printed circuit board, each of said second electronic components being between one of said first electronic components and the printed circuit board, said second electronic components being arranged substantially along a second line angularly deviated from the first line, the second line angularly deviated from the first line such that each of the electrodes can be observed along a view-line parallel to the first line.

8. A printed circuit board assembly as recited in claim 7, wherein at least one of said second electronic components has two groups of electrodes to be soldered to the printed circuit board, each of the groups substantially aligned with a third line substantially orthogonal to the first line.

9. An assembly for a printed circuit board having a rectangular shape, said assembly comprising:

a plurality of first electronic components each having two facing longitudinal sides from each of which a plurality of lead wires extend, said first electronic components being mounted via the lead wires onto the printed circuit board with a predetermined clearance from the printed circuit board, said longitudinal two sides of each of said first electronic components being arranged along a line lateral to the printed circuit board; and a plurality of second electronic components each having terminal electrodes on two facing sides of said second electronic components, said second electronic components being mounted under each of said first electronic components onto the printed circuit board, each of said second electronic components being arranged substantially along a pitched line deviating from the line lateral to the printed circuit board such that each of the terminal electrodes can be observed through gaps of the lead wires of said first electronic components along a view-line parallel to the line lateral to the printed circuit board.

10. A method of manufacturing a printed circuit board assembly, said method comprising the steps of:
(a) mounting, substantially along rows and columns, a plurality of first electronic components on a printed circuit board;
(b) mounting, before said mounting in step (a), a plurality of second electronic components on the printed circuit board substantially along a line pitched from at least one of the rows and columns.

11. A method according to claim 10, wherein said mounting in step (a) mounts each of the first electronic components above at least one of the second electronic components.

12. A method according to claim 11, wherein said mounting in steps (a) and (b) mounts the first and second electronic components substantially parallel to an edge of the printed circuit board.

13. A method according to claim 10, wherein said mounting in step (b) mounts the second electronic components along the line adequately pitched at an angle from the rows and columns to enable visual inspection of said mounting of the second electronic components in step (b).

14. A method according to claim 13, further comprising the step of (c) visually inspecting said mounting performed in step (b).

15. A method according to claim 10, wherein said mounting in step (a) mounts groups of electrodes on the second electronic components substantially along at least one of the rows and columns.

* * * * *